United States Patent
Hiraoka

(10) Patent No.: US 9,853,216 B2
(45) Date of Patent: Dec. 26, 2017

(54) METHOD AND APPARATUS FOR CORRECTING BRIGHT SPOTS IN AN OLED BY LASER

(71) Applicant: JOLED INC., Tokyo (JP)

(72) Inventor: Tomomi Hiraoka, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/891,780

(22) PCT Filed: May 19, 2014

(86) PCT No.: PCT/JP2014/002611
§ 371 (c)(1),
(2) Date: Nov. 17, 2015

(87) PCT Pub. No.: WO2014/188695
PCT Pub. Date: Nov. 27, 2014

(65) Prior Publication Data
US 2016/0126458 A1    May 5, 2016

(30) Foreign Application Priority Data

May 23, 2013 (JP) ................................ 2013-109227

(51) Int. Cl.
*H01L 51/00* (2006.01)
*C09K 11/06* (2006.01)
(Continued)

(52) U.S. Cl.
CPC .......... *H01L 51/0027* (2013.01); *C09K 11/06* (2013.01); *H01L 27/3241* (2013.01);
(Continued)

(58) Field of Classification Search
CPC ............. H01L 51/0027; H01L 27/3241; H01L 27/3246; H01L 51/5281; H01L 51/56;
(Continued)

(56) References Cited

U.S. PATENT DOCUMENTS 7,234,984 B2   6/2007  Nishikawa et al.
7,611,745 B2  11/2009  Nishikawa et al.
(Continued)

FOREIGN PATENT DOCUMENTS

JP   2003-272845    9/2003
JP   2009-016195    1/2009
(Continued)

OTHER PUBLICATIONS

International Search Report (ISR) from International Searching Authority (Japan Patent Office) in International Patent Application No. PCT/JP2014/002611, dated Aug. 19, 2014.

*Primary Examiner* — Peter Bradford
(74) *Attorney, Agent, or Firm* — Greenblum & Bernstein, P.L.C.

(57) ABSTRACT

A method includes: (a) preparing the organic electroluminescence display apparatus including: plural elements in which a reflective anode, an organic layer including an emission layer, and a transparent cathode are stacked; and partition walls, in which at least one of the picture elements is a bright spot defective element that always lights or blinks and (b) applying a laser beam to an area of the transparent cathode in the bright spot defective element, to draw a closed line and to have an unirradiated area along a periphery of the area, the area reflecting an emitting part. Step (b) includes (b-1) transforming the transparent cathode and an electron transmission layer by focusing the laser beam on the transparent cathode. In step (b-1), an area transformed in the electron transmission layer is enlarged by application of the laser beam.

18 Claims, 11 Drawing Sheets

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5281* (2013.01); *H01L 51/56* (2013.01); *C09K 2211/1029* (2013.01); *H01L 2227/323* (2013.01); *H01L 2251/568* (2013.01)

(58) Field of Classification Search
CPC ........ H01L 2227/323; H01L 2251/568; C09K 11/06; C09K 2211/1029
See application file for complete search history.

(56) References Cited

U.S. PATENT DOCUMENTS

| | | | |
|---|---|---|---|
| 7,955,151 B2 | 6/2011 | Fujimaki | |
| 7,964,416 B2 | 6/2011 | Miyazawa | |
| 8,258,692 B2 | 9/2012 | Hong et al. | |
| 8,518,719 B2 | 8/2013 | Hiraoka et al. | |
| 8,765,494 B2 | 7/2014 | Hiraoka et al. | |
| 2003/0222861 A1 | 12/2003 | Nishikawa et al. | |
| 2004/0202777 A1 | 10/2004 | Nishikawa et al. | |
| 2009/0061720 A1 | 3/2009 | Fujimaki | |
| 2010/0044691 A1 | 2/2010 | Hong et al. | |
| 2010/0164375 A1* | 7/2010 | Kajiyama | H01L 27/3244 313/504 |
| 2010/0207106 A1* | 8/2010 | Lhee | H01L 27/3244 257/40 |
| 2011/0104842 A1 | 5/2011 | Miyazawa | |
| 2012/0270460 A1* | 10/2012 | Miyazawa | H01L 51/56 445/2 |
| 2013/0102094 A1 | 4/2013 | Hiraoka et al. | |
| 2014/0068925 A1* | 3/2014 | Park | G02F 1/1309 29/593 |

FOREIGN PATENT DOCUMENTS

| | | |
|---|---|---|
| JP | 2009-064607 | 3/2009 |
| JP | 2010-050081 | 3/2010 |
| JP | 2011-100608 | 5/2011 |
| JP | 2012-022843 | 2/2012 |
| WO | 2013/038454 | 3/2013 |

* cited by examiner

Applying laser beam

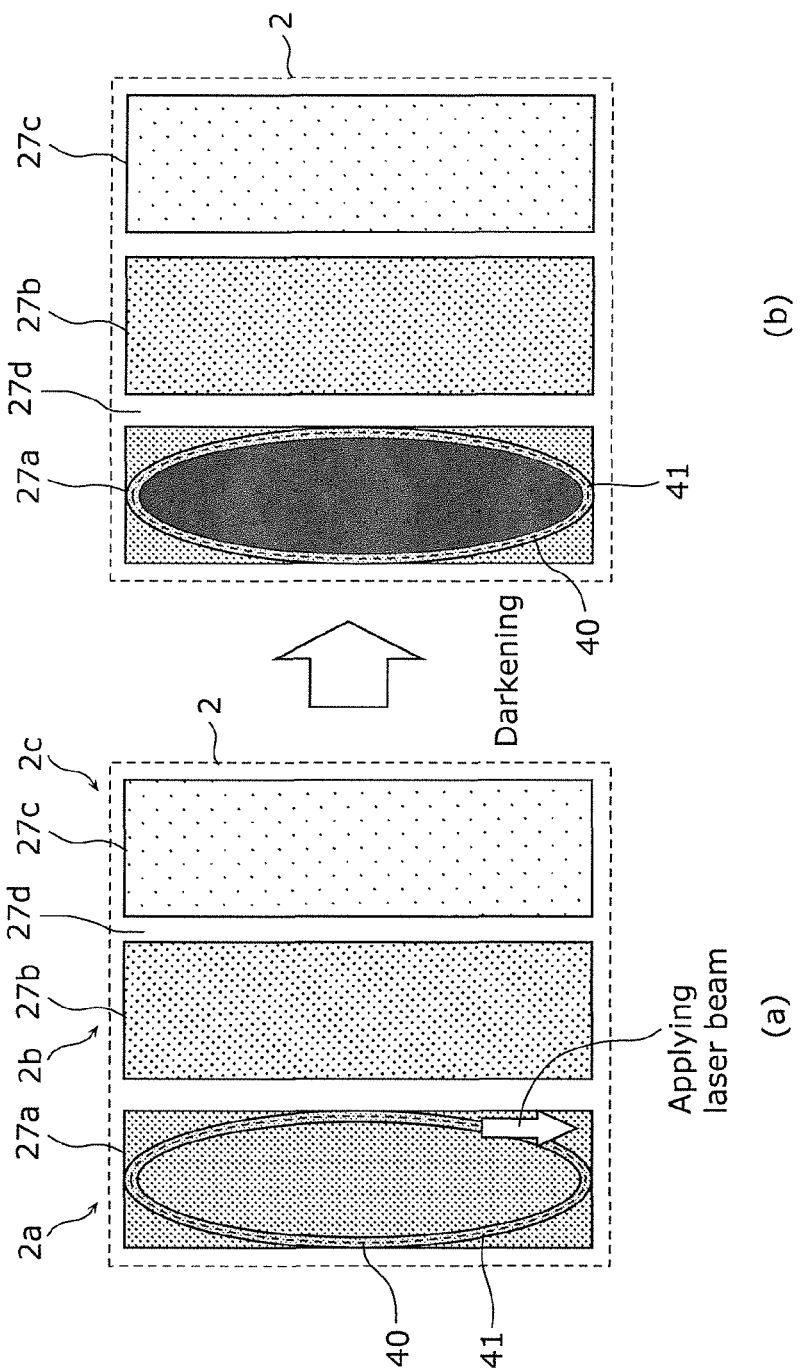

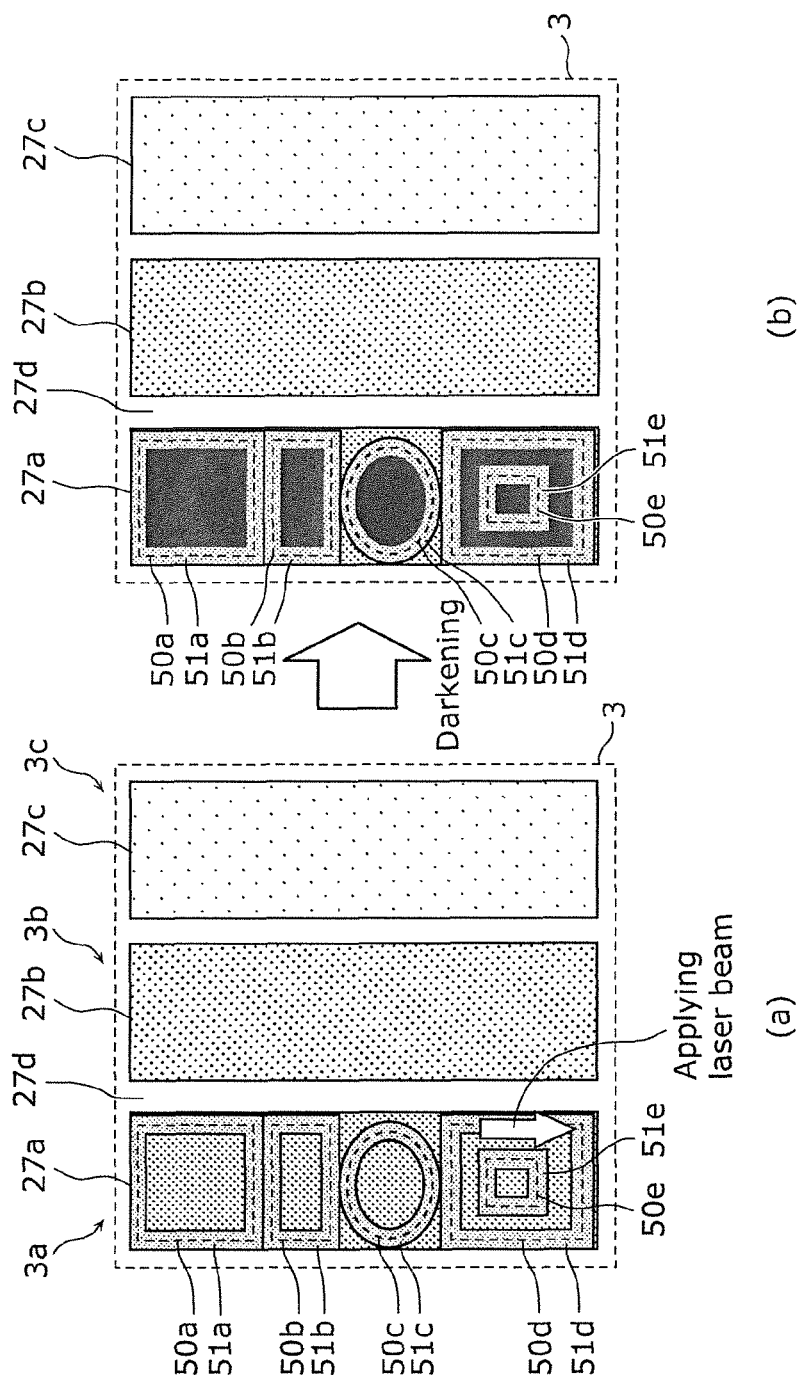

METHOD AND APPARATUS FOR CORRECTING BRIGHT SPOTS IN AN OLED BY LASER

TECHNICAL FIELD

The present invention relates to a method of manufacturing an organic electroluminescence (EL) display apparatus and the organic EL display apparatus.

BACKGROUND ART

PTL 1 and PTL 2 disclose methods of repairing organic light emitting display apparatuses. The methods relate to a method of repairing an organic light emitting display apparatus including an organic light emitting element that (i) has plural picture elements each of which has, on a board, a first electrode, an organic layer having an emitting layer, and a second electrode in this order, and (ii) emits light in an emitting area where the first electrode and the second electrode overlap each other with the organic light emitting element therebetween. In the method, a laser beam is applied to a periphery of the emitting area in a picture element that always emits light.

The method of repairing an organic light emitting display apparatus is thus provided which can reduce a vanishing area in an electrode, and suppress deterioration in the quality of displaying.

CITATION LIST

[PTL 1] Japanese Unexamined Patent Application Publication No. 2009-64607
[PTL 2] Japanese Unexamined Patent Application Publication No. 2012-022843

SUMMARY OF INVENTION

Technical Problem

The present disclosure provides a method of manufacturing an organic EL display apparatus capable of stably darkening a bright spot defective element, and an organic EL display apparatus.

Solution to Problem

A method of manufacturing an organic electroluminescence display apparatus according to the present disclosure includes: (a) preparing the organic electroluminescence display apparatus that includes: a plurality of picture elements in which a lower electrode, an organic layer including an emission layer, and an upper electrode are stacked; and partition walls each disposed between adjacent ones of the picture elements, each of the partition walls having a forward-tapered shape in a cross section, in which at least one of the picture elements is a bright spot defective element that always lights or blinks, and (b) applying a laser beam to an area of the upper electrode in the bright spot defective element, to draw a closed line and to have an unirradiated area along a periphery of the area, the area reflecting an emitting part separated by bottom edges of the partition walls, in which step (b) includes (b-1) transforming the upper electrode and an electron transmission layer by focusing the laser beam on the upper electrode, and in step (b-1), an area that is transformed in the electron transmission layer is enlarged by application of the laser beam.

Advantageous Effects of Invention

With a method of manufacturing an organic EL display apparatus and the organic EL display apparatus according to the present disclosure, a picture element in a bright spot defective element can be stably darkened.

BRIEF DESCRIPTION OF DRAWINGS

FIG. 10 includes (a) and (b) which are top views showing an organic EL display apparatus according to another embodiment, for indicating a position to which a laser beam is applied, (a) showing a status before the laser beam is applied, and (b) showing a status after the laser beam is applied.
FIG. 11 includes (a) and (b) which are top views showing an organic EL display apparatus, for indicating a position to which a laser beam is applied, (a) showing a status before the laser beam is applied, and (b) showing a status after the laser beam is applied.

DESCRIPTION OF EMBODIMENTS

Hereinafter, certain exemplary embodiments are described in greater detail with reference to the accompanying drawings. Unnecessarily detailed description may be omitted. For example, detailed description of well known matters, and duplicate description of substantially identical structure may be omitted. This avoids the following description from being unnecessarily redundant, and allows a person skilled in the art to easily understand the present disclosure.

It should be noted that inventors provide the accompanying drawings and the description below for enhancing a person skilled in the art to understand the present disclosure sufficiently. Accordingly, the inventors do not intend to limit the subject matters recited in claims by the drawings and the description.

Embodiment

Before describing the embodiment, underlying knowledge for achieving the present disclosure is described.

Figure 1:
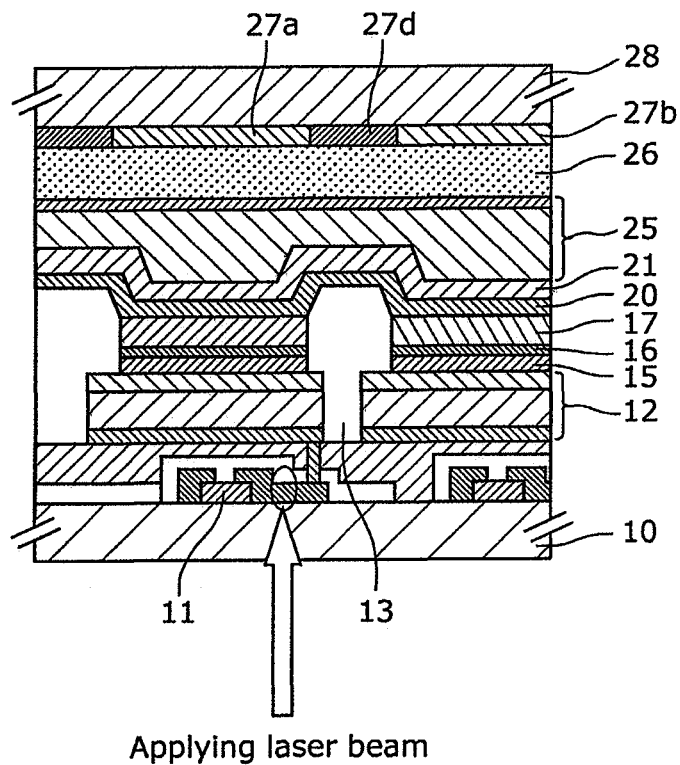
FIG. 1 is a cross sectional view showing a customary organic EL display apparatus.

FIG. 1 is a cross sectional view showing a customary organic EL display apparatus.

As shown in FIG. 1, the customary organic EL display apparatus includes a semiconductor layer including a glass board 10 on which thin film transistors (TFTs) 11 are disposed. A reflective anode 12 and partition walls 13 are formed above the semiconductor layer. A hole injection layer (HIL) 15, an injection layer (IL) 16, and an emission layer (EML) 17 are formed above the reflective anode 12.

An electron transmission layer (ETL) 20 and a transparent cathode 21 are formed on the emission layer 17 and the partition walls 13. A sealing resin 26 is disposed above the transparent cathode 21 so as to eliminate a step caused by the emission layer 17 and the partition walls 13. Color filters 27a, 27b, and 27c different in color for individual picture elements (see FIG. 5) separated by each of the partition walls 13 are formed on the sealing resin 26. For example, the color filter 27a is a red filter, the color filter 27b is a green filter, and the color filter 27c is a blue filter. Black matrixes 27d each are formed in individual spaces between the color filters 27a, 27b, and 27c.

A glass board 28 is disposed on the color filters 27a, 27b, and 27c.

In the customary organic EL display apparatus, a short circuit in a TFT wiring or another reason may cause a driving TFT to be uncontrollable. This allows a current to continuously flow to an EL side, causing a so-called a bright spot defective element to occur. In such a case, a laser beam is applied from a panel backside, i.e., a glass board 10 side, to a wiring portion that connects the reflective anode 12 and the TFTs 11, so as to cut the wiring formed on the semiconductor layer, and thus the bright spot defective element is darkened. In this method, however, the wiring and the reflective anode 12 may be in contact with each other due to an impact by irradiation with the laser beam, or short circuit defect may be caused between individual layers in plural wiring layers. This may cause deterioration in repair efficiency upon the repairing performed by applying the laser beam to the bright spot defective element.

Figure 2:
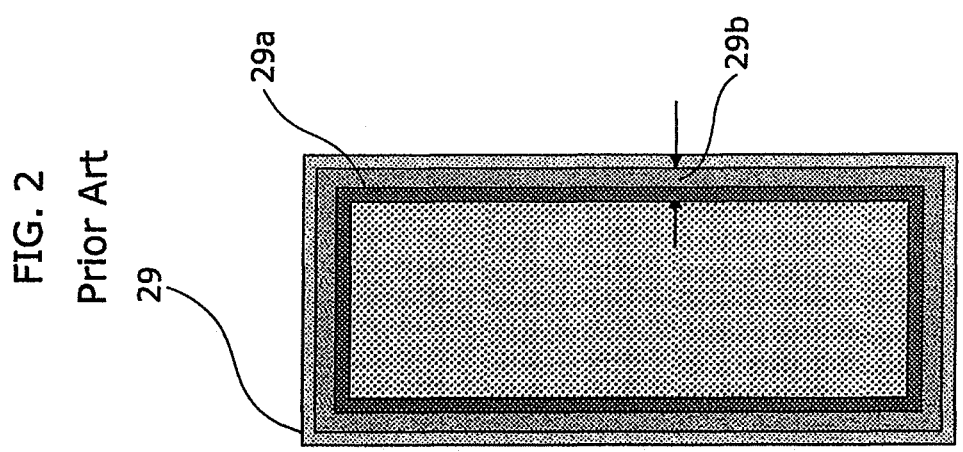
FIG. 2 is a top view showing an example of a picture element irradiated with a laser beam.

FIG. 2 is a top view showing the customary organic EL display apparatus, for indicating a position to which the laser beam is applied.

As shown in FIG. 2, a customary method of repairing an organic EL display apparatus includes a method in which a laser beam is applied to an outer periphery of an emitting area of a picture element 29. In this method, an unlit area 29b is generated around an outer periphery 29a irradiated with the laser beam. However, an area that emits light remains along the outer periphery of the unlit area 29b.

Figure 3:
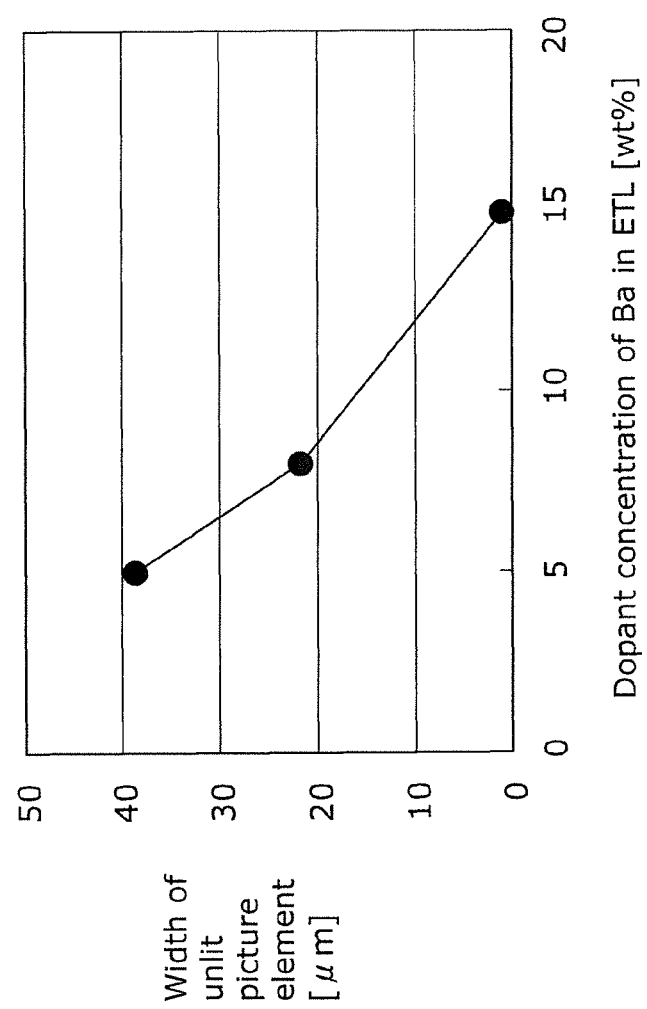
FIG. 3 is a graph showing a relationship between a dopant concentration of barium in an electron transmission layer and a width of an unlit picture element after repairing.

Further, inventors of the present disclosure have found a relationship shown in FIG. 3 between a dopant concentration of barium and a width of the unlit area 29b after repairing. FIG. 3 is a graph showing the relationship between the dopant concentration of barium in an electron transmission layer and the width of the unlit area in the repaired picture element.

As shown in FIG. 3, as the dopant concentration of barium in the electron transmission layer increases, the width of the unlit area 29b decreases. In view of this, the width of the unlit area 29b is adjusted by doping barium in the electron transmission layer 20. Specifically, the width of the unlit area 29b can be controlled in a range from 0 to 40 μm inclusive, by adjusting an amount of the doped barium in a range from 5 to 15 weight % inclusive, based on the relationship shown in FIG. 3.

It should be noted that a material to be doped is not limited to the barium. If an alkali metal is doped, the control similar to the above can be performed.

According to the present embodiment, a bright spot defect is eliminated in a method described below.

Hereinafter, the present embodiment is described with reference to FIGS. 4 to 9.

[1-1. Structure of Organic EL Display Apparatus]

Figure 4:
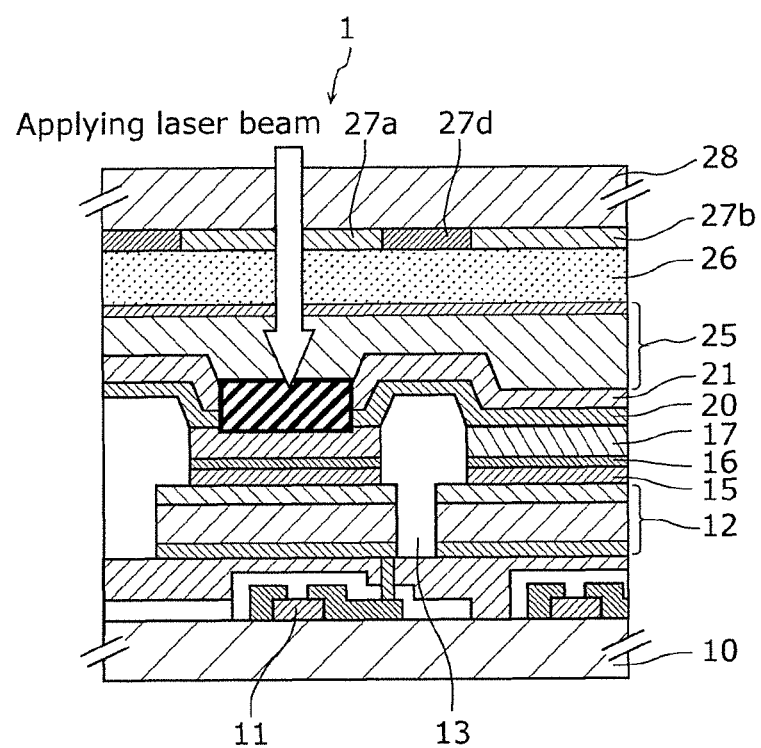
FIG. 4 is a cross-sectional schematic view showing an organic EL display apparatus according to an embodiment.

FIG. 4 is a cross-sectional schematic view showing an organic EL display apparatus according to the present embodiment.

As shown in FIG. 4, an organic EL display apparatus 1 is substantially identical to the aforementioned customary organic EL display apparatus in structure, and includes a semiconductor layer in which the TFTs 11 are disposed on the glass board 10. The reflective anode 12 and the partition walls 13 are formed above the semiconductor layer via a flattening film made of an insulation organic material.

The reflective anode 12 is provided with a hole. This means that the reflective anode 12 is an anode into which a current flows from an external circuit. The reflective anode 12 corresponds to a lower electrode in the present disclosure. The reflective anode 12 has a configuration that an electrode made of, for example, aluminium (Al) or silver alloy (an alloy containing Ag, Pd, and Cu) is stacked on the flattening film. A thickness of the reflective anode 12 is 10 to 40 nm inclusive, for example. The reflective anode 12 may employ, for example, a two-layer structure including an indium tin oxide (ITO) and the silver alloy APC, or other materials.

The individual partition walls 13 separate the emission layer 17 into plural emitting areas, and are made of photosensitive resin, for example. Each of the partition walls has a forward-tapered shape in a cross section, as shown in FIG. 4.

The hole injection layer (HIL) 15, the injection layer (IL) 16, and the emission layer (EML) 17 are formed above the reflective anode 12.

The hole injection layer 15 is made mainly of a material having a hole injection property. The material having a hole injection property has a function of injecting, to the emission layer 17, a hole injected from the reflective anode 12 side, in a stable manner or with assisting the generation of the hole. A compound, such as polyethylenedioxythiophene (PEDOT), aniline, and so on are used for the material, for example.

A voltage is applied between the reflective anode 12 and the transparent cathode 21, allowing the emission layer 17 to emit light. The emission layer 17 has a stacked configuration including α-NPD(Bis[N-(1-naphthyl)-N-phenyl]benzidine) as a lower layer and Alq$_3$(tris-(8-hydroxyquinoline)aluminum) as an upper layer. The emission layer 17 has an area separated by bottom edges of the partition walls 13, which is called as an emitting area.

The electron transmission layer (ETL) 20 and the transparent cathode 21 are formed above the emission layer 17 and the partition walls 13.

The electron transmission layer 20 is made mainly of a material having an electron injection property. The material having the electron injection property has a function of injecting electrons injected from the transparent cathode 21 to the emission layer 17 stably or with assisting the generation of the electron. For example, derivatives, such as polyphenylenevinylene (PPV), aluminium quinolinol complex, oxadiazole derivative, triazole derivative, and bathophenanthroline derivative are used for the material. An alkali metal, in particular, barium is preferably doped in the electron transmission layer 20.

The transparent cathode 21 is a cathode to which electrons are supplied, in other words, from which a current flows to an external circuit. The transparent cathode 21 corresponds to an upper electrode in the present disclosure. The transparent cathode 21 is made of a metal oxide, and has a stacked structure including an indium titanium oxide (ITO) which is a transparent metal oxide, for example. The transparent cathode 21 can be made of magnesium (Mg), silver (Ag), and so on, so as to serve as a transparent electrode. A thickness of the transparent cathode 21 ranges, for example, from 20 to 50 nm inclusive.

The sealing resin 26 is disposed above the transparent cathode 21 so as to eliminate a step caused by the emission layer 17 and the partition walls 13. Further, color filters 27a, 27b, and 27c different in color for individual picture elements 1a, 1b, 1c (see FIG. 5) separated by each of the partition walls 13 are formed on the sealing resin 26. For example, the color filter 27a is a red filter, the color filter 27b is a green filter, and the color filter 27c is a blue filter. Black matrixes 27d each are formed in individual spaces between the color filters 27a, 27b, and 27c.

A glass board 28 is disposed on the color filters 27a, 27b, and 27c and the black matrixes 27d.

The glass boards 10 and 28 serve as a board that protects an emitting surface of an emitting panel, and are transparent alkali-free glasses having a thickness of 0.5 mm.

A single pixel includes picture elements 1a, 1b, and 1c which respectively have the color filters 27a, 27b, and 27c. The single pixel has a size at a degree of 225 μm×225 μm, for example. Each of the picture elements 1a, 1b, and 1c has a size of 50 μm×225 μm, for example. Spaces between adjacent ones of the picture elements 1a, 1b, and 1c are each 20 μm, for example.

In the present disclosure, an organic layer includes the hole injection layer 15, the emission layer 17, and the electron transmission layer 20. The organic layer includes a hole transmission layer and an electron transmission layer, if these layers are included in the present disclosure. A thickness of the organic layer ranges from 100 to 200 nm inclusive, for example. The picture elements 1a, 1b, and 1c each include the reflective anode 12, the organic layer, the transparent cathode 21, the sealing resin 26, and the glass board 28 which are disposed in the emitting area separated by the partition walls 13.

In the organic EL display apparatus 1 shown in FIG. 4, a bright spot defective element 1a is present, and the bright spot defective element is eliminated (repaired). Specifically, a laser beam is applied to the transparent cathode 21 that is the upper electrode, from the glass board side, so that resistance is increased in a part of the transparent cathode 21.

Figure 5:
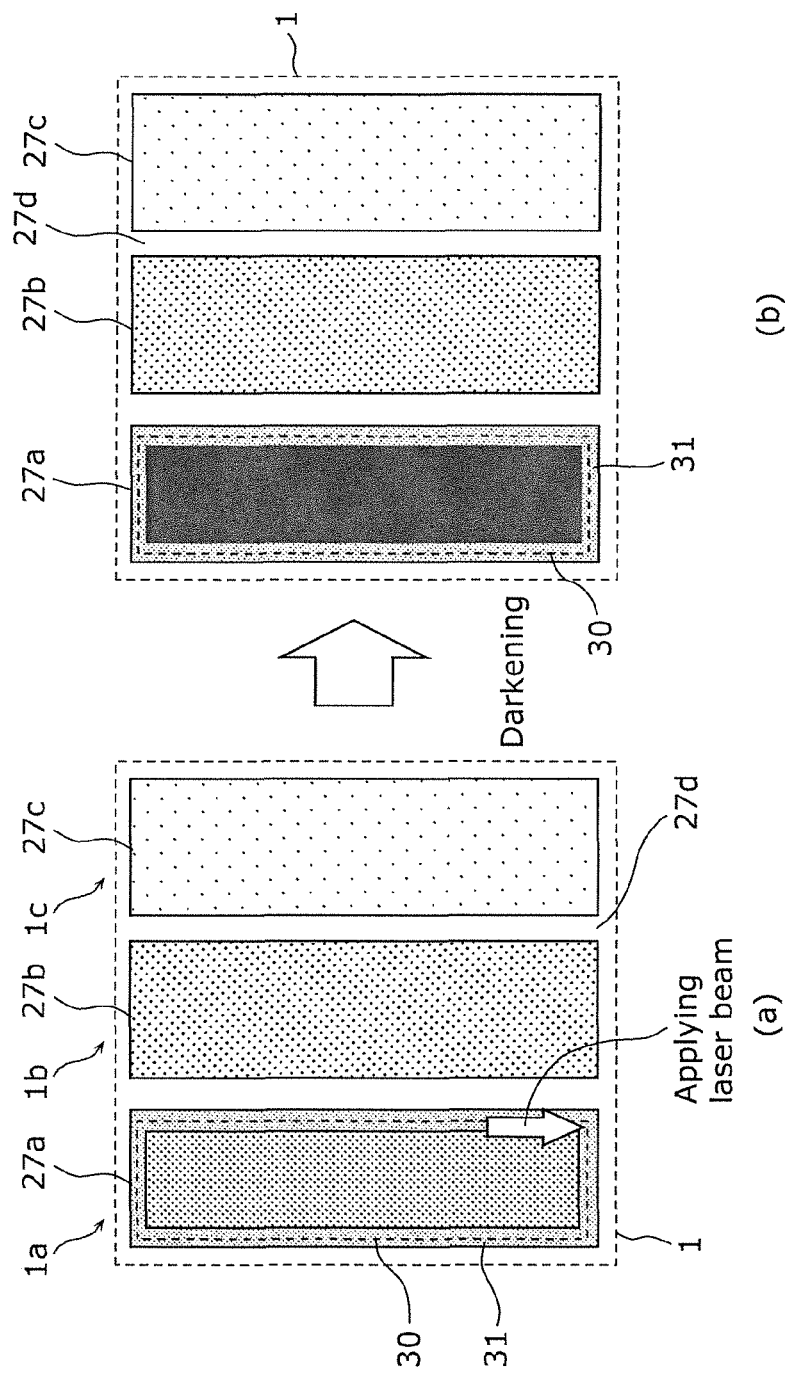
FIG. 5 includes (a) and (b) which are top views showing the organic EL display apparatus, for indicating a position to which the laser beam is applied, (a) showing a status before the laser beam is applied, and (b) showing a status after the laser beam is applied.

FIG. 5 includes (a) and (b) which are top views showing the organic EL display apparatus 1, for indicating a position to which the laser beam is applied. The drawing (a) shows a status before the laser beam is applied, and the drawing (b) shows a status after the laser beam is applied. In FIG. 3, it is assumed that a bright spot defect occurs in the picture element 1a having the color filter 27a. The bright spot defective element 1a is defective as a bright spot, so that no foreign substance that is conductive is mixed in the emitting area.

As shown in (a) of FIG. 5, the laser beam is applied to the transparent cathode 21 in the bright spot defective element 1a so as to enclose the bright spot defective element 1a. A position to which the laser beam is applied will be described later in detail in [1-2. Method for manufacturing organic EL display apparatus].

The application of the laser beam increases the resistance at a part of each of the transparent cathode 21 and the emission layer 17 (which are to be transformed). An inside of the emitting area irradiated with the laser beam is thus electrically isolated, thereby impeding the current to flow. Accordingly, as shown in (b) of FIG. 5, an inside of the transformed area is darkened. Further, the laser beam is applied to the transparent cathode 21. Accordingly, the wiring and the reflective anode may not be in contact with each other due to the impact by the irradiation with the laser beam, or a plurality of wiring layers may not be short-circuited. The present disclosure thus allows the bright spot defective element to be stably darkened.

[1-2. Method for Manufacturing Organic EL Display Apparatus]

A method of manufacturing the organic EL display apparatus 1 is now described.

First, a step of forming the organic EL display apparatus 1 is described. A flattening film made of an insulation organic material is formed on the glass board 10 including TFTs, and the reflective anode 12 is then formed on the flattening film.

The reflective anode 12 formed in such a manner that an AL film is deposited on the flattening film by a spattering method, for example, and a patterning step is substantially conducted using photolithography and wet etching.

The hole injection layer 15 is formed in such a manner that PEDOT is dissolved in a solution containing xylene, and the obtained PEDOT solution undergoes spin coating.

Then, α-NPD and Alq$_3$ are stacked on the hole injection layer 15 using a vacuum evaporation method, for example, so as to form the emission layer 17.

For the occasion, polyphenylene vinylene (PPV) is dissolved in a solvent containing, for example, xylene or chloroform, and then the spin coating is conducted to the obtained result. The electron transmission layer 20 is thus formed on the emission layer 17.

In view of FIG. 3, an alkali metal, in particular, barium may be doped in the electron transmission layer 20. An amount of the doped barium is adjusted in a range from 5 to 15 weight % inclusive, allowing the width of the unlit area 29b to be controlled in a range from 0 to 40 μm inclusive. Accordingly, a width in which the transformed area is enlarged on the electron transmission layer 20 can be adjusted by irradiation with the laser beam.

The electron transmission layer 20 may include a quinolinol complex of aluminium, an oxadiazole derivative, a triazole derivative, and a bathophenanthroline derivative.

The transparent cathode 21 is subsequently formed without exposing, on atmospheric, the board on which the electron transmission layer 20 is formed. Specifically, the transparent cathode 21 is formed by stacking the ITO to a thickness of 35 nm, for example, on the electron transmission layer 20 using the spattering method. For the occasion, the transparent cathode 21 is in an amorphous state.

According to the aforementioned manufacturing steps, the organic EL display apparatus 1 having a function as an emitting element is formed. The partition walls 13 made of surface photosensitive resin are formed at predetermined positions, between a step of forming the reflective anode 12 and a step of forming the hole injection layer 15.

A silicon nitride is stacked to a thickness of 500 nm, for example, using a plasma CVD method, on the transparent cathode 21, so as to form the sealing resin 26. The sealing resin 26 is formed in contact with a surface of the transparent cathode 21. Accordingly, a strict requirement as a protection layer may be necessary for the sealing resin 26. In view of the above, a non-oxygen inorganic material represented by the aforementioned silicon nitride is preferably used. Further, the sealing resin 26 may include, for example, an oxide inorganic material, such as a silicon oxide ($Si_xO_Y$), a silicon oxynitride ($Si_xO_YN_Z$), or a plurality of layers formed by stacking these inorganic materials. The forming steps are not limited to the plasma CVD method, and other methods including a spattering method using an argon plasma, and the like, may be used.

Subsequently, the glass board 28 is disposed on the applied sealing resin 26. Here, the color filters 27a, 27b, and 27c are formed in advance on a main surface of the glass board 28. Then, the glass board 28 is disposed on the applied sealing resin 26, with setting the main surface, downward, on which the color filters 27a, 27b, and 27c are formed. The sealing resin 26 and the grass board 28 function as protection layers.

The grass board 28 is eventually pressed downward from an upper surface side, and heat or an energy grade line is added to harden the sealing resin 26, so that the glass board 28 and the sealing resin 26 are adhered.

According to the aforementioned forming method, the organic EL display apparatus 1 shown in FIG. 4 is formed.

It should be noted that steps of forming the reflective anode 12, the hole injection layer 15, the emission layer 17, the electron transmission layer 20, and the transparent cathode 21 are not limited to those described in the present disclosure.

Here, it is assumed that the picture element 1a having the color filter 27a is a picture element having the bright spot defect (bright spot defective element), and the picture elements 1b and 1c respectively having the color filters 27b and 27c are normal picture elements. In the organic EL display apparatus 1, the bright spot defect in the picture element 1a (bright spot defective element 1a) is eliminated. Hereinafter, description is carried out for a method of darkening the bright spot defective element in the organic EL display apparatus 1.

Figure 6:
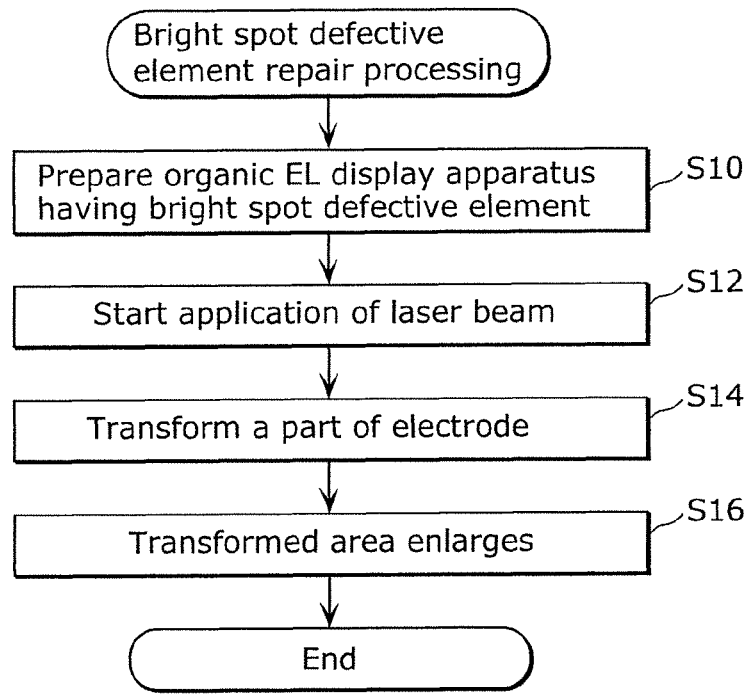
FIG. 6 is a flowchart showing steps of darkening a bright spot defective element in the organic EL display apparatus.

FIG. 6 is a flowchart showing steps of darkening a bright spot defective element in the organic EL display apparatus 1. As shown in FIG. 6, the organic EL display apparatus 1 having the bright spot defective element is first prepared in steps of darkening the bright spot defective element in the organic EL display apparatus 1 (Step S10). For the occasion, a position of the bright spot defective element 1a may be detected in the organic EL display apparatus 1 in advance.

Figure 7:
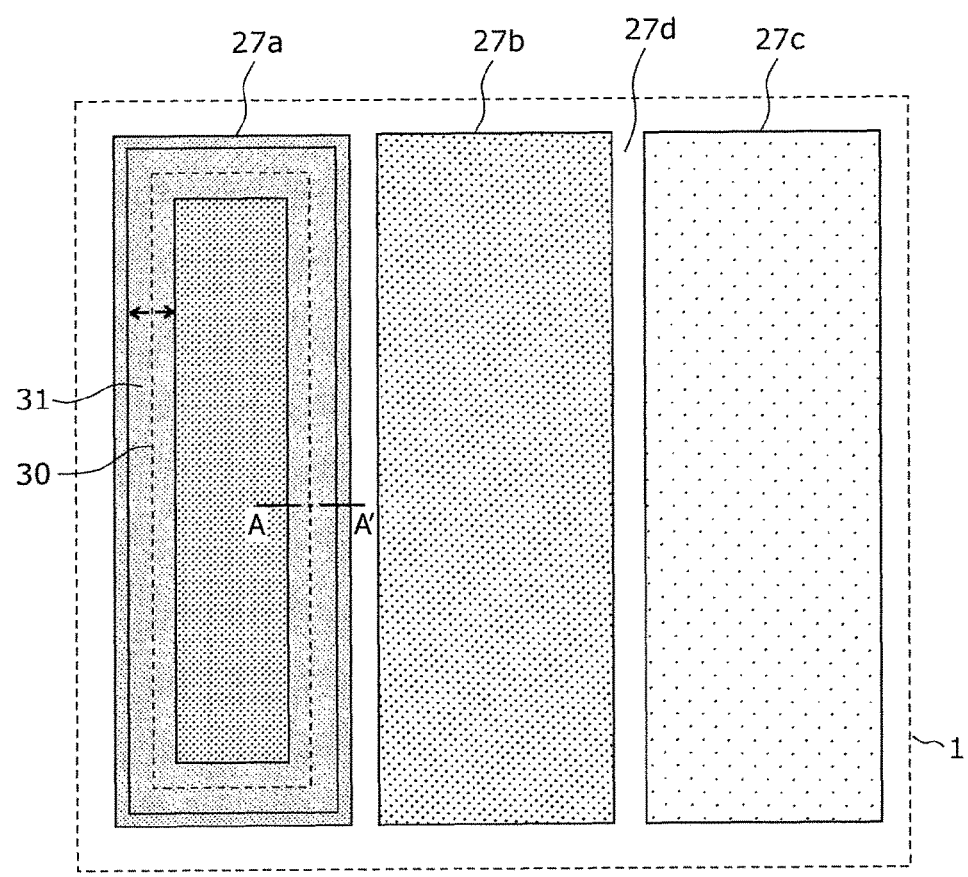
FIG. 7 is a top view showing the organic EL display apparatus, for indicating a position to which the laser beam is applied.

Application of the laser beam starts to the bright spot defective element 1a (Step S12). FIG. 7 is a top view showing the organic EL display apparatus, for indicating the position to which the laser beam is applied.

The laser beam is applied to the bright spot defective element 1a to draw a closed line on an inside of an area of the transparent cathode 21 serving as the upper electrode. The area reflects an emitting area separated by bottom edges of the partition walls 13. The application of the laser beam is also performed along a periphery of the area reflected on the transparent cathode 21 with leaving an area that is not irradiated with the laser. Here, the laser beam is applied in a manner of drawing a line in the emitting area along the edge of the partition wall 13 with a predetermined space from the edge of the partition wall 13, while a movable stage on which the organic EL display apparatus 1 is mounted or an optical axis of the laser beam is scanned. The laser beam may be applied along an edge of the black matrix 27d, instead of the edge of the partition wall 13.

Specifically, the laser beam is applied to the transparent cathode 21 in the bright spot defective element 1a so as to enclose the bright spot defective element 1a, as indicated by a broken line 30 in FIG. 7. This causes a part of the transparent cathode 21 to have high resistance, i.e., to be transformed (Step S14). As shown in FIG. 7, an area that has high resistance, i.e., a transformed layer 31, enlarges from a position indicated by the broken line 30 along which the laser beam is applied, due to a gas occurring at processing of the application of the laser beam (Step S16). The transformed layer 31 enlarges to the bottom edge of the partition wall 13, for example. At this time, the sealing resin 26, the color filters 27a, 27b, and 27c, and the black matrix 27d are not transformed by the application of the laser beam. The transformed layer 31 may enlarge over an upper edge of the partition wall 13.

The application of the laser beam is not limited to the line-drawing application, but may be conducted through an optical image forming system using a mask that has an opening in a line shape.

For the laser beam, an ultrashort pulse laser having a wavelength of 800 nm or more is used. A width of the line drawn by the laser beam ranges, for example, from 3 to 10 μm inclusive. The accuracy of the line drawn by the laser beam in the Z direction ranges, for example, from ±1 to 2 μm, inclusive. The laser beam is applied with focusing on the transparent cathode 21. The high resistance area enlarges to an area from 1 to 20 μm inclusive, from the line drawn by the laser beam. In other words, the area from 1 μm or more to 20 μm or less from the line drawn by the laser beam is transformed. This reduces brightness of the entire emitting area in the bright spot defective element 1a. The bright spot defective element 1a is thus darkened. The laser beam may be applied with focusing on the transparent cathode 21 and the electron transmission layer 20.

A type of the laser beam is not limited to the aforementioned ultrashort pulse laser, but may be a femtosecond laser, for example.

Figure 8:
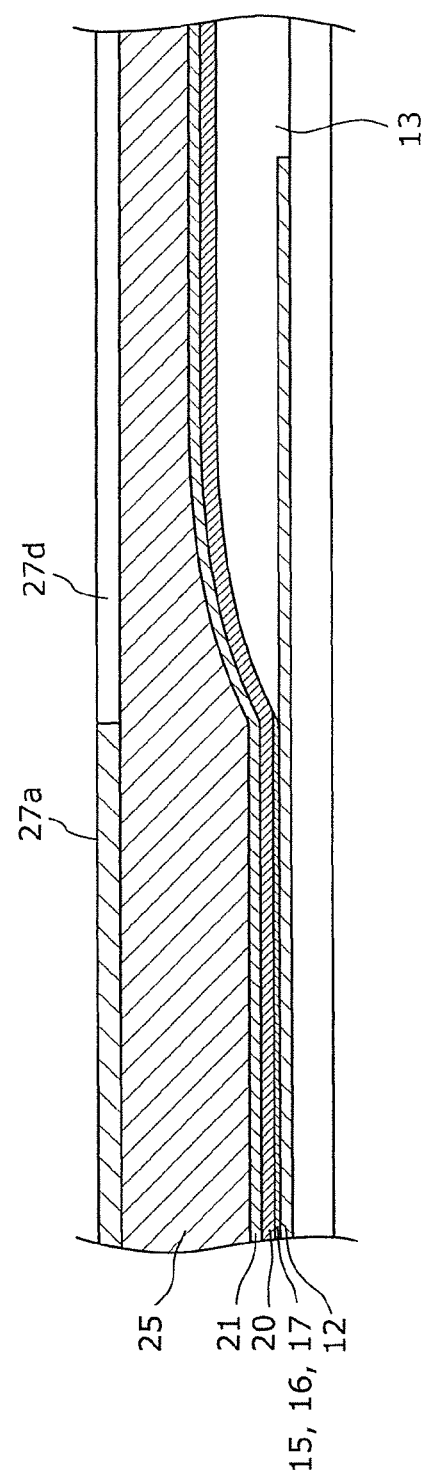
FIG. 8 is a cross sectional schematic view showing steps of darkening the bright spot defective element in the organic EL display apparatus.
Figure 9:
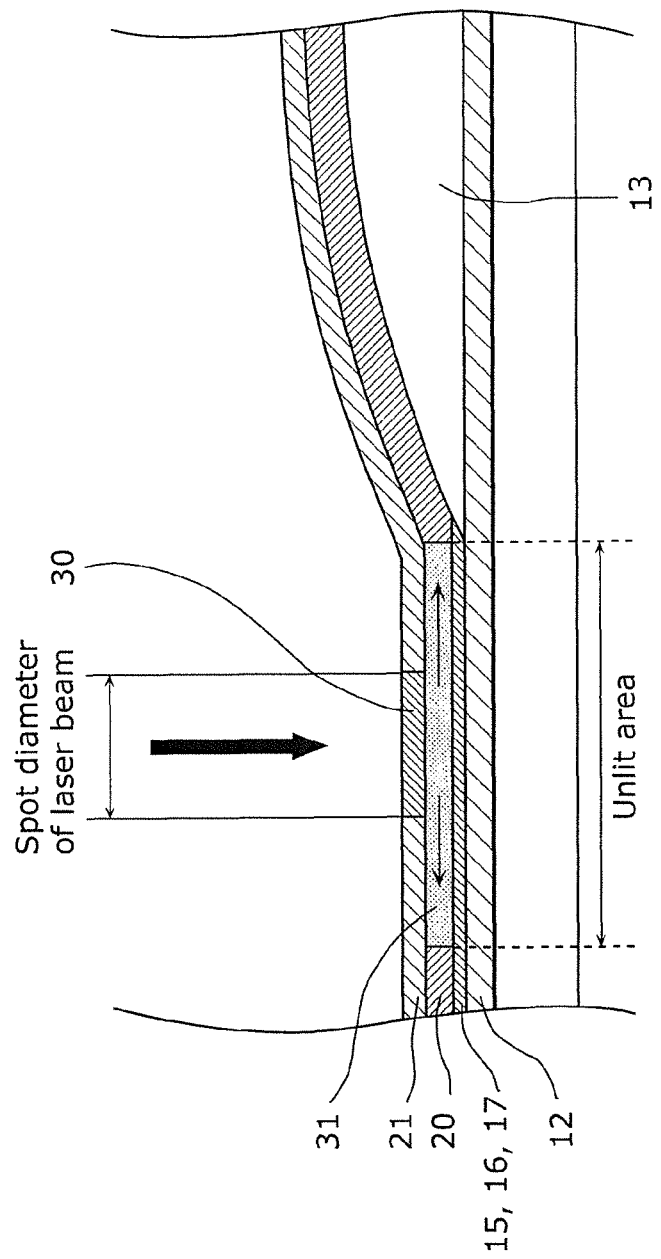
FIG. 9 is a cross sectional schematic view showing steps of darkening the bright spot defective element in the organic EL display apparatus.

The transformed layer 31 is described in more detail. FIG. 8 is a cross sectional schematic view showing steps of darkening the bright spot defective element 1a in the organic EL display apparatus 1. FIG. 9 is a cross sectional schematic view showing steps of darkening the bright spot defective element 1a in the organic EL display apparatus 1.

As shown in FIG. 8, the partition wall 13 slopes with respect to the reflective anode 12 in the organic EL display apparatus 1. Specifically, the partition wall 13 has a forward-tapered shape in a cross section. The electron transmission layer 20 and the transparent cathode 21 cover the partition wall 13. Accordingly, difference occurs in height in the electron transmission layer 20 and the transparent cathode 21 between those formed above the partition wall 13 and those formed above the emission layer 17.

The laser beam is applied to a position indicated by the broken line 30 shown in FIG. 7 in the transparent cathode 21, allowing an area having a width substantially equal to a spot diameter of the laser beam to have high resistance, or to be transformed in the transparent cathode 21. The electron transmission layer 20 is transformed by an influence of the gas generated due to the laser beam applied to the transparent cathode 21, and thus to be unlit. This transformed area is enlarged to be larger than a spot diameter of the laser beam by the gas generated at the irradiation with the laser beam, as shown in FIG. 9. The transformed area enlarges up to a surrounding area around the periphery of the bright spot defective element 1a, i.e., up to the bottom edges of the partition walls 13. The surrounding area around the bright spot defective element 1a corresponds to a surrounding area of an area defined by a closed line in the upper electrode. The area defined by the closed line reflects, to the upper electrode, the emitting area separated by the bottom edges of the partition walls 13.

As mentioned above, the laser beam is not applied to the boundary between the partition wall 13 and the emission layer 17, but applied to an inside of the area surrounded by the boundary between the partition wall 13 and the emission layer 17, along the bottom edge of the partition wall 13 with leaving a predetermined space from the bottom edge of the partition wall 13. This allows the bright spot defective element 1a to be darkened without leaving an emitting area outside the area surrounded by the boundary between the partition wall 13 and the emission layer 17.

[1-3. Effect, etc]

According to the present embodiment, a method of manufacturing an organic electroluminescence display apparatus, includes: (a) preparing the organic electroluminescence display apparatus that includes: a plurality of picture elements in which a lower electrode, an organic layer including an emission layer, and an upper electrode are stacked; and partition walls each disposed between adjacent ones of the picture elements, each of the partition walls having a forward-tapered shape in a cross section, in which at least one of the picture elements is a bright spot defective element that always lights or blinks, and (b) applying a laser beam to an area of the upper electrode in the bright spot defective element, to draw a closed line and to have an unirradiated area along a periphery of the area, the area reflecting an emitting part separated by bottom edges of the partition walls, in which step (b) includes (b-1) transforming the upper electrode and an electron transmission layer by focusing the laser beam on the upper electrode, and in step (b-1), an area that is transformed in the electron transmission layer is enlarged by application of the laser beam.

Accordingly, the bright spot defective element can be darkened without leaving an emitting area outside the area surrounded by the partition wall and the emission layer. This allows the bright spot defective element to be stably darkened.

According to the present embodiment, step (b) includes (b-1) transforming the upper electrode and an electron transmission layer by focusing the laser beam on the upper electrode.

Accordingly, the laser beam is applied to the upper electrode, causing the upper electrode and the electron transmission layer to be transformed. This eliminates possibilities that a wiring and the lower electrode are in contact with each other due to an impact by the irradiation with the laser beam, and a plurality of wiring layers are short circuited.

According to the present embodiment, in step (b-1), an area that is transformed in the electron transmission layer is enlarged by application of the laser beam.

Accordingly, the transformed area in the electron transmission layer enlarges from the position where the laser beam is applied, due to a gas generated at the processing of applying the laser beam. This allows the entire emitting area to be darkened, even if an area that is not irradiated with the laser beam is left along the periphery of the area reflecting, to the upper electrode, the emitting area separated by the bottom edges of the partition walls.

According to the present embodiment, the laser beam is applied to the emitting part along an edge of each of the partition walls to draw a line.

Accordingly, the laser beam can be applied to a desired position easily, in accordance with a shape and a size of the bright spot defective element. This allows the bright spot defective element to be easily darkened.

According to the present embodiment, the laser beam is applied through an optical image forming system using a mask having a linear opening that extends along an edge of each of the partition walls.

Accordingly, the laser beam can be simultaneously applied to a plurality of bright spot defective elements, so as to form the transformed layer. This allows a plurality of the bright spot defective elements to be easily darkened.

According to the present embodiment, the laser beam is applied to draw plural closed line shapes from an edge of the partition wall to the emitting part.

Accordingly, a shape, size, and the number of the area which is to be darkened can be changed in accordance with the shape and size of the bright spot defective element. This allows the bright spot defective element to be surely darkened.

According to the present embodiment, the laser beam is an ultrashort pulse laser.

Accordingly, the laser beam can pass through a color filter. This allows the bright spot defective element to be surely darkened.

According to the present embodiment, the laser beam is a femtosecond laser.

Accordingly, an organization structure of a transparent conductive material which has difficulty to be processed by other laser beams can be transformed and has high resistance. This allows the bright spot defective element to be surely darkened.

According to the present embodiment, at least one of the upper electrode and the lower electrode includes a metal oxide.

Accordingly, a femtosecond laser beam can be applied through a transparent electrode. This allows the electron transmission layer to be transformed more surely.

According to the present embodiment, an organic electroluminescence display apparatus includes: a plurality of picture elements in which a lower electrode, an organic layer including an emission layer, and an upper electrode are stacked; partition walls each disposed between adjacent ones of the picture elements, each of the partition wall having a forward-tapered shape in a cross section; and at least one bright spot defective element that always lights or blinks, among the picture elements, in which in the at least one bright spot defective element, a laser beam is applied to an area of the upper electrode to draw a closed line and to have an unirradiated area along a periphery of the area, thereby transforming the upper electrode and an electron transmission layer, the area reflecting an emitting part separated by bottom edges of the partition walls, the electron transmission layer has a transformed area that reaches at least a level defined by the bottom edges of the partition walls.

Accordingly, the bright spot defective element can be darkened without leaving the emitting area outside the area enclosed by the boundary between the partition wall and the emission layer. This allows the bright spot defective element to be stably darkened.

Other Embodiments

As mentioned above, the embodiment is described as an example of a technology described in the present application. However, the technology of the present disclosure is not limited to the above, and is applicable to an embodiment to which change, replace, addition, omission, etc is appropriately conducted. The structural elements described in the aforementioned embodiment can be combined with each other to make a new embodiment.

Hereinafter, other embodiments are described as a whole.

FIG. 10 includes (a) and (b) which are top views showing an organic EL display apparatus 2 according to an another embodiment, for indicating a position to which a laser beam is applied. The drawing (a) shows a status before the laser beam is applied, and the drawing (b) shows a status after the laser beam is applied. FIG. 11 includes (a) and (b) which are top views showing an organic EL display apparatus 3, for indicating a position to which a laser beam is applied. The drawing (a) shows a status before the laser beam is applied, and the drawing (b) shows a status after the laser beam is applied.

The laser beam is not necessarily applied to draw a rectangular shape in accordance with a shape of a bright spot defect element 2a, but may be applied to draw an another shape. The laser beam may be applied to the transparent cathode 21 in the bright spot defective element 2a, to draw an elliptical shape, for example, as indicated by a broken line 40 shown in (a) of FIG. 10.

A part of the transparent cathode 21 thus has high resistance. Accordingly, the part does not allow a current to flow. In such a case, an area which has the high resistance in the transparent cathode 21, i.e., a transformed layer 41, is enlarged from a position to which the laser beam is applied and which is indicated by the broken line 40. Accordingly, as shown in (b) of FIG. 10, an inside of the transformed area 41 is darkened. According to the present disclosure, the bright spot defect element 2a can be thus darkened stably.

The laser beam may be applied so that a plurality of darkened areas are formed in the bright spot defective element 2a. Specifically, the laser beam may be applied to draw plural number of closed line shapes in the emitting area from an edge of the partition wall 13. For example, the laser beam may be applied multiple times to multiple areas, as indicated by broken lines 50a, 50b, 50c, and 50d in (a) of FIG. 11. A shape of the area irradiated with the laser beam may be a rectangular, like areas indicated by the broken lines 50a, 50b, or 50d, and may be a circle or an ellipse, like an area indicated by the broken line 50c. As indicated by the broken line 50e, the laser beam may be additionally applied to an area inside the area to which the laser beam has been applied.

Accordingly, a part of the transparent cathode 21 has high resistance. The part does not allow a current to flow. In such a case, areas in the transparent cathode 21, which have the high resistance, i.e., transformed layers 51a, 51b, 51c, 51d, and 51e, enlarge from positions to which the laser beam is applied and which are indicated by the broken lines 50a, 50b, 50c, 50d, and 50e. Accordingly, as shown in (b) of FIG. 11, an inside area of each of the transformed areas 51a, 51b, 51c, 51d, and 51e, is darkened. According to the present disclosure, the bright spot defective element can be stably darkened.

Although the lower electrode is an anode, and the upper electrode is a cathode in the aforementioned embodiment, the lower electrode may be a cathode, and the upper electrode may be an anode. The organic EL display apparatus includes structural elements, such as the flattening film, reflective anode, hole injection layer, emission layer, partition wall, electron injection layer, transparent cathode, sealing resin, and glass board. Those structural elements are not limited to the structure described in the aforementioned embodiment. A material, structure, and forming method of these structural elements may be changed. For example, a hole transmission layer may be disposed between the hole injection layer and the emission layer, or an electron transmission layer may be disposed between the electron injection layer and the emission layer.

The laser beam may be applied not only to the upper electrode, but also to the lower electrode As aforementioned, the embodiment is described as an example of the technology in the present disclosure. For the description, the drawings and the detailed description are provided.

Accordingly, the structural elements described in the attached drawings and the detailed description include essential structural elements for solving the problem and structural elements not necessary for solving the problem but necessary for exemplifying the above technology. Therefore, the structural elements not necessary for solving the problem should not be recognized as the essential structural elements.

It should be considered that the disclosed embodiments exemplify the technology of the present disclosure. Modification, replace, addition, omission and so on can be conducted on the appended claims and their equivalents.

INDUSTRIAL APPLICABILITY

The present disclosure is applicable to a method of manufacturing an organic EL display apparatus capable of stably darkening a bright spot defective element, and the organic EL display apparatus. Specifically, the present disclosure is applicable to a flat panel television required to have a large screen and high resolution, and to a display of a personal computer.

REFERENCE SIGNS LIST 1, 2, 3 Organic EL display
1a, 1b, 1c Picture element, Bright spot defective element
2a, 2b, 2c, 3a, 3b, 3c Picture element
10, 28 Glass board
11 TFT
12 Reflective anode (Lower electrode)
13 Partition wall
15 Hole injection layer (Organic layer)
16 Injection layer (Organic layer)
17 Emission layer
20 Electro transmission layer (Organic layer)
21 Transparent cathode (Upper electrode)
26 Sealing resin
27a, 27b, 27c Color filter
27d Black matrix
31, 41, 51a, 51b, 51c, 51d, 51e Transformed layer

The invention claimed is:
1. A method of manufacturing an organic electroluminescence display apparatus, the method comprising:
preparing the organic electroluminescence display apparatus, the organic electroluminescence display apparatus including:
a plurality of picture elements in which a lower electrode, an organic layer including an emission layer, and an upper electrode are stacked; and
partition walls each disposed between adjacent ones of the picture elements, each of the partition walls having a forward-tapered shape in a cross section, wherein at least one of the picture elements is a bright spot defective element that always lights or blinks; and applying a laser beam to an area of the upper electrode in the bright spot defective element, to draw a closed line and to have an unirradiated area along a periphery of the area, the area corresponding to an emitting part of the emission layer, the emitting part being separated by bottom edges of the partition walls, wherein the applying of the laser beam includes
transforming, in the bright spot defective element, the upper electrode and an electron transmission layer by focusing the laser beam on the upper electrode, and in the transforming, an area that is transformed in the electron transmission layer in the bright spot defective element is enlarged by application of the laser beam.

2. The method according to claim 1,
wherein the laser beam is applied to the emitting part along an edge of each of the partition walls to draw the closed line.

3. The method according to claim 1,
wherein the laser beam is applied through an optical image forming system using a mask, the mask having a linear opening that extends along an edge of each of the partition walls.

4. The method according to claim 1,
wherein the laser beam is applied to the area of the upper electrode in the bright spot defective element to draw plural closed line shapes corresponding to the emitting part.

5. The method according to claim 1,
wherein the laser beam is an ultrashort pulse laser.

6. The method according to claim 1,
wherein the laser beam is a femto second laser.

7. The method according to claim 1,
wherein at least one of the upper electrode and the lower electrode comprises a metal oxide.

8. The method according to claim 1,
wherein the closed line defines an enclosed area on an inside of the upper electrode in the bright spot defective element, the unirradiated area surrounding the enclosed area.

9. The method according to claim 8,
wherein the area of the electron transmission layer in the bright spot defective element that is transformed includes a first portion of the electron transmission layer below a first portion of the upper electrode in the enclosed area and a second portion of the electron transmission layer below a second portion of the upper electrode in the unirradiated area.

10. The method according to claim 9,
wherein, in the transforming, a resistance of the area of the electron transmission layer in the bright spot defective element that is transformed is increased.

11. The method according to claim 9,
wherein, in the transforming, the area of the electron transmission layer in the bright spot defective element is transformed by an influence of gas generated due to the applying of the laser beam to the area of the upper electrode in the bright spot defective element.

12. The method according to claim 9,
wherein, in the transforming, the area of the electron transmission layer in the bright spot defective element is enlarged to be larger than a spot diameter of the laser beam.

13. The method according to claim 9,
wherein, in the transforming, the area of the electron transmission layer in the bright spot defective element is enlarged up to the bottom edges of the partition walls.

14. The method according to claim 9,
wherein, in the transforming, the area of the electron transmission layer in the bright spot defective element is enlarged over upper edges of the partition walls.

15. The method according to claim 9,
wherein the enclosed area has a rectangular shape.

16. The method according to claim 9,
wherein the enclosed area has a non-rectangular shape.

17. The method according to claim 9,
wherein the enclosed area has an elliptical shape.

18. The method according to claim 1, further comprising:
changing at least one of a shape and a size of the area of the upper electrode in the bright spot defective element in accordance with a shape and a size of the bright spot defective element.

* * * * *